(12) United States Patent
Pille et al.

(10) Patent No.: US 10,653,049 B2
(45) Date of Patent: May 12, 2020

(54) FRAMES FOR SHIELDING ASSEMBLIES AND SHIELDING ASSEMBLIES INCLUDING THE SAME

(71) Applicant: Laird Technologies, Inc., Chesterfield, MO (US)

(72) Inventors: James D. Pille, Ashley, IL (US); Gerald R. English, Glen Ellyn, IL (US); Timothy M. Wrona, Schaumburg, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 16/591,029

(22) Filed: Oct. 2, 2019

(65) Prior Publication Data

US 2020/0113091 A1    Apr. 9, 2020

Related U.S. Application Data

(60) Provisional application No. 62/741,771, filed on Oct. 5, 2018.

(51) Int. Cl.
*H05K 9/00* (2006.01)
*H05K 5/00* (2006.01)

(52) U.S. Cl.
CPC ......... *H05K 9/0032* (2013.01); *H05K 5/0004* (2013.01); *H05K 9/0081* (2013.01)

(58) Field of Classification Search
CPC .................................................. H05K 9/0032
See application file for complete search history.

(56) References Cited

U.S. PATENT DOCUMENTS

| | | |
|---|---|---|
| 5,095,177 A | 3/1992 | Johnson |
| 5,353,201 A | 10/1994 | Maeda |
| 6,181,573 B1 | 1/2001 | Riet |
| 7,429,192 B2 | 9/2008 | Liao et al. |
| 7,488,902 B2 | 2/2009 | English et al. |
| 7,916,500 B2 | 3/2011 | Shi et al. |
| 7,926,166 B2 | 4/2011 | Zuehlsdorf et al. |
| 9,247,682 B2 | 1/2016 | Watanabe |
| 2016/0113161 A1 | 4/2016 | Ball et al. |
| 2017/0135200 A1* | 5/2017 | Chang ...................... F16B 2/22 |
| 2017/0171961 A1* | 6/2017 | Ball ..................... H05K 9/0032 |

OTHER PUBLICATIONS

Innovative Board-Level Shielding, Gore Snapshot EMI Shields, gore.com/emi, Copyright 2015, 2 pages.

* cited by examiner

*Primary Examiner* — Hung V Ngo
(74) *Attorney, Agent, or Firm* — Harness, Dickey & Pierce, P.L.C.; Anthony G. Fussner

(57) ABSTRACT

According to various aspects, exemplary embodiments are disclosed of frames for shielding assemblies. Exemplary embodiments are also disclosed of shielding assemblies including such frames. In exemplary embodiments, a frame for a board level shield (BLS) may include portions alignable with and solderable to solder ball pads along a printed circuit board. A cover may be releasably attachable to, detachable from, and reattachable to the frame.

15 Claims, 17 Drawing Sheets

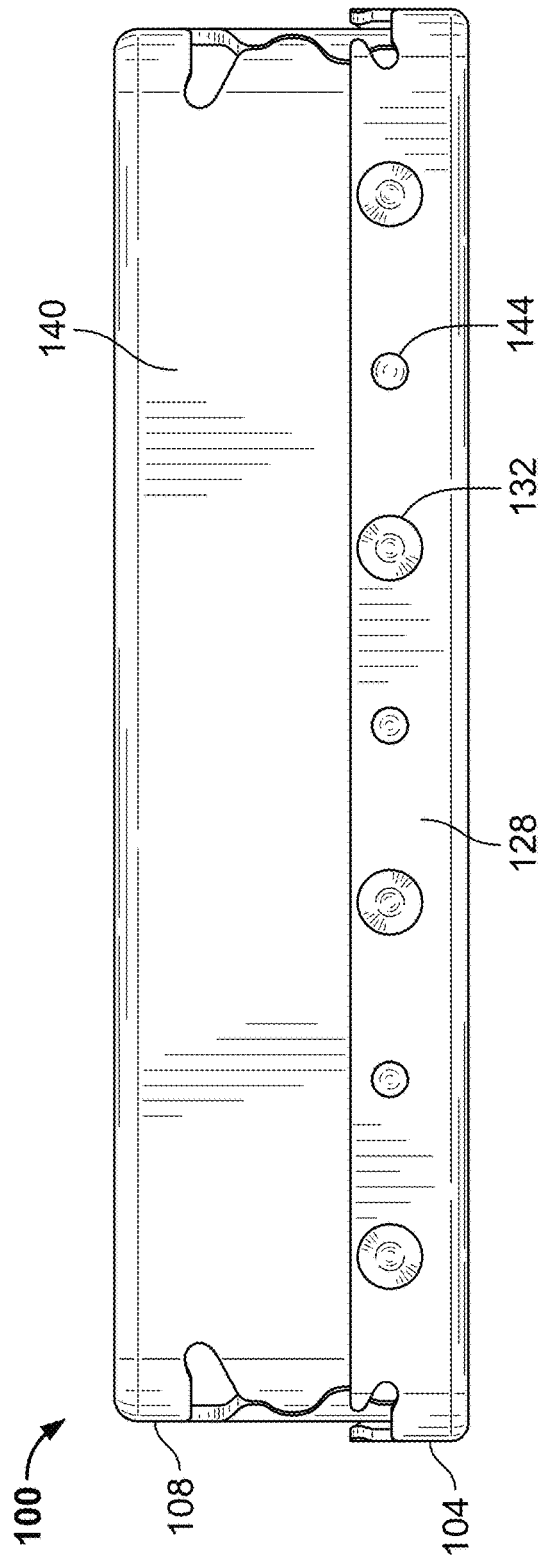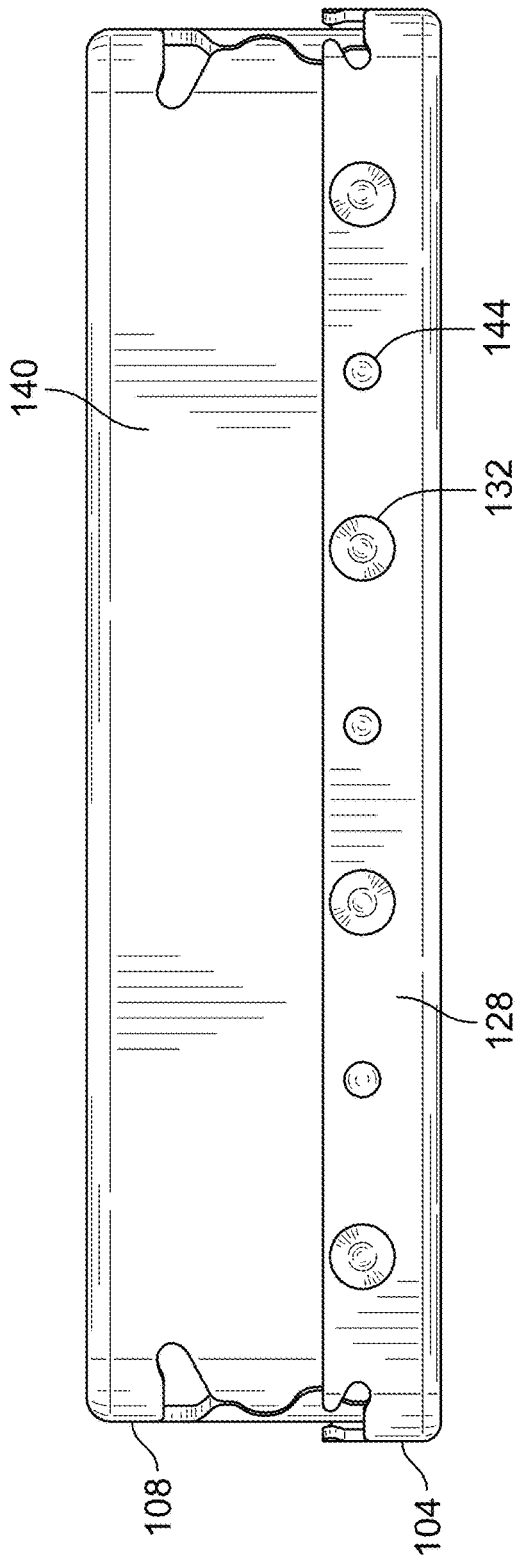

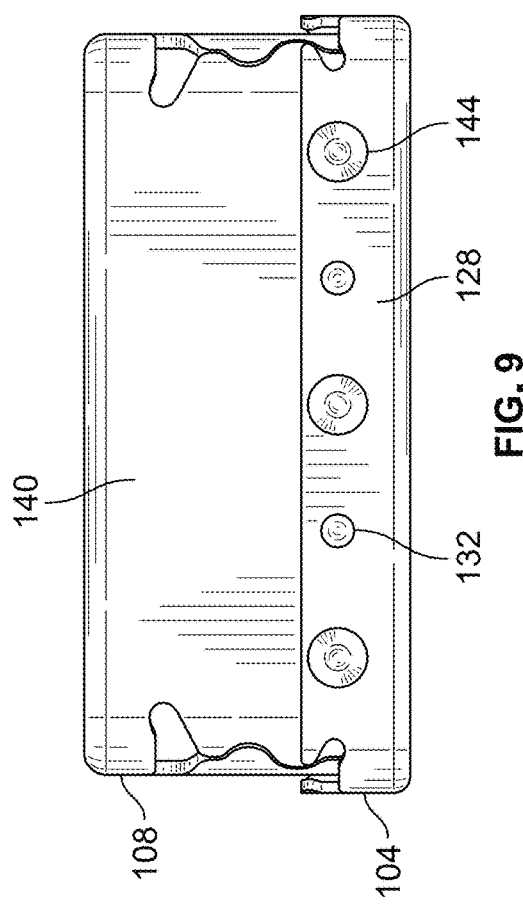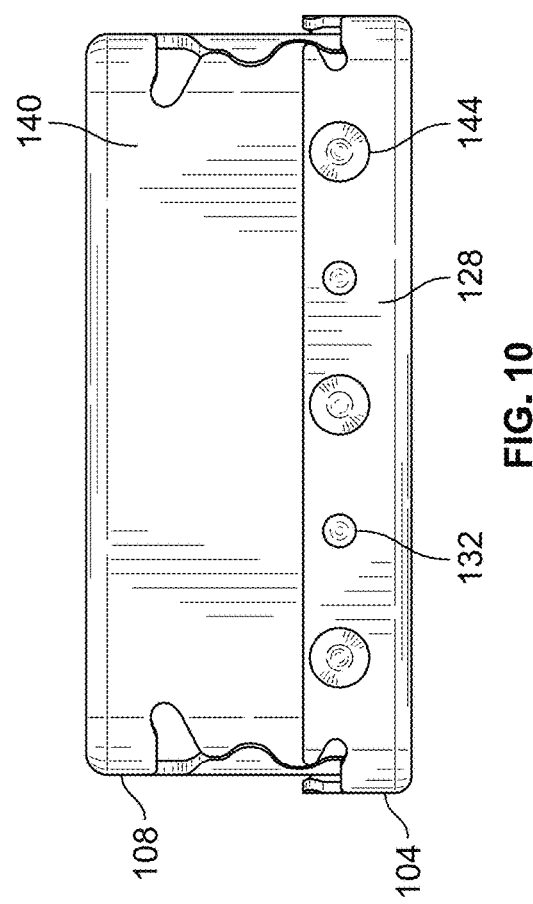

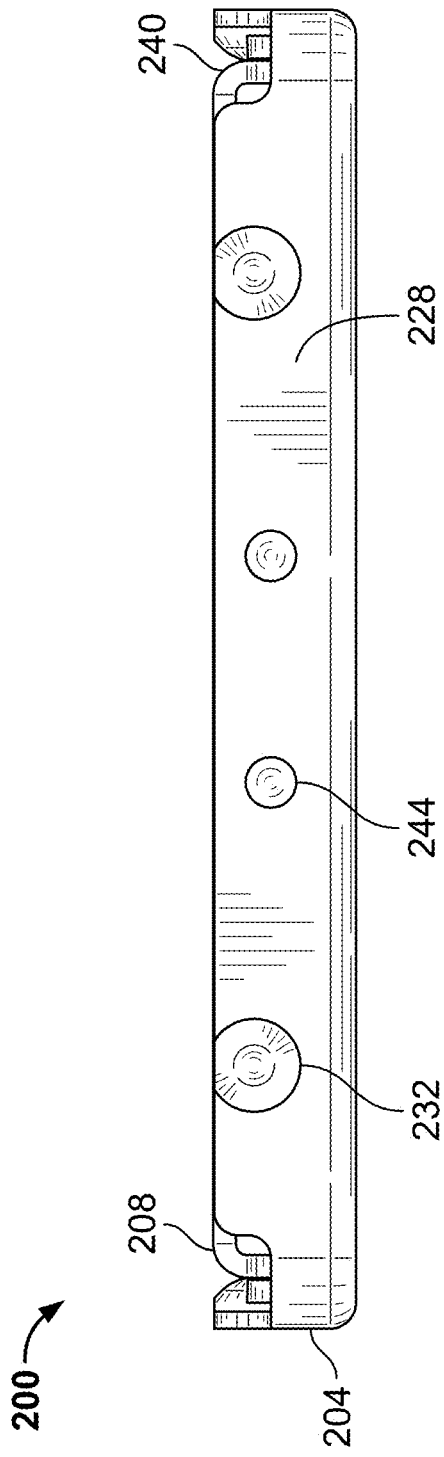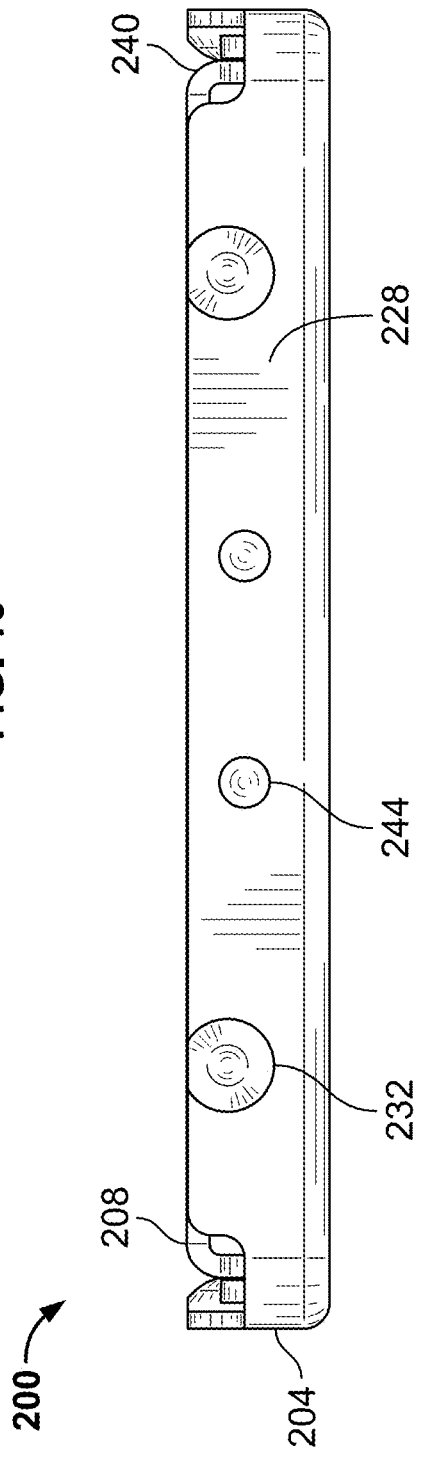

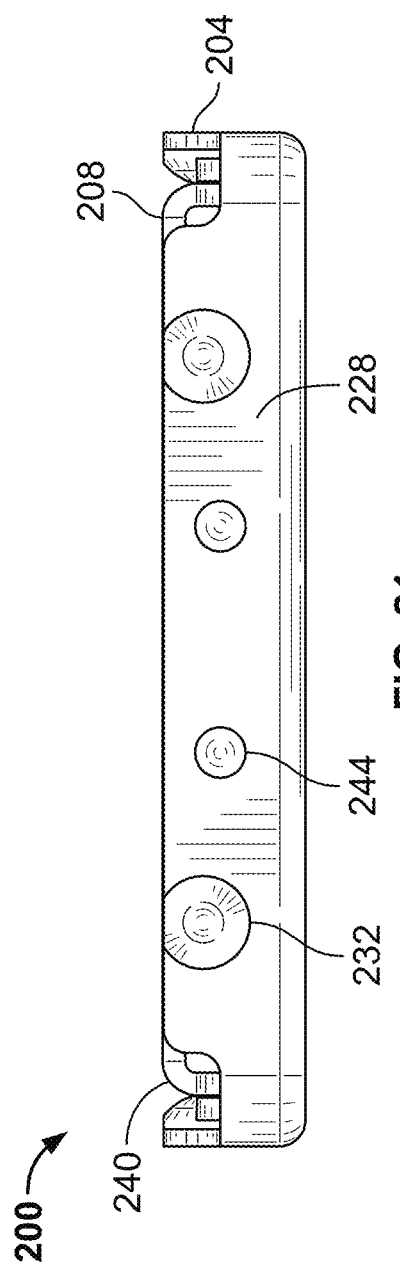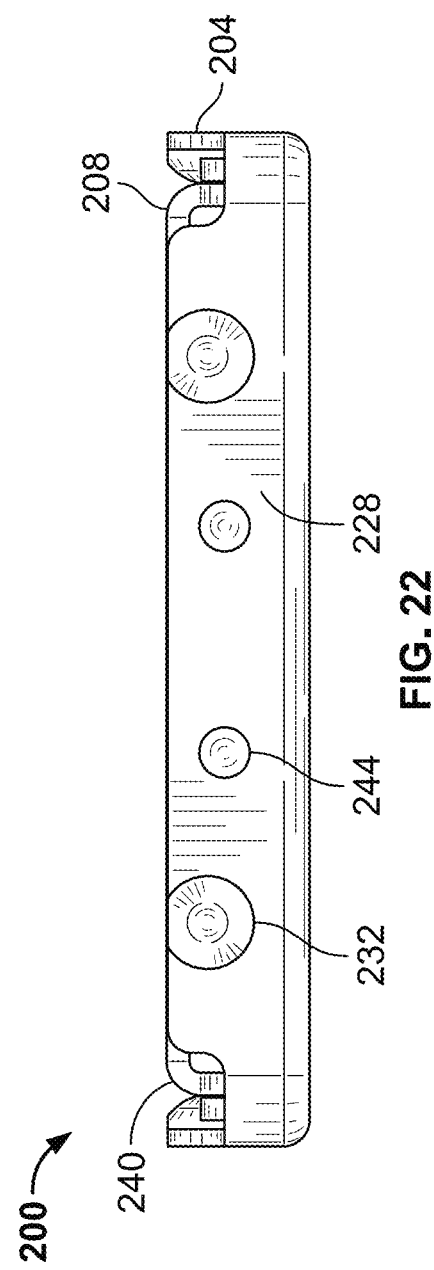

FRAMES FOR SHIELDING ASSEMBLIES AND SHIELDING ASSEMBLIES INCLUDING THE SAME

CROSS-REFERENCE TO RELATED APPLICATION

This application claims priority to and the benefit of U.S. Provisional Patent Application No. 62/741,771 filed Oct. 5, 2018. The entire disclosure of this provisional application is incorporated herein by reference.

FIELD

The present disclosure generally relates to frames for shielding assemblies and shielding assemblies including the same. For example, a frame for a board level shield (BLS) may include portions alignable with and solderable to solder ball pads along a printed circuit board. A cover may be releasably attachable to, detachable from, and reattachable to the frame.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source. For example, board level shields are widely used to protect sensitive electronic devices against inter and intra system electromagnetic interferences and reduce unwanted electromagnetic radiations from a noisy integrated circuit (IC).

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

FIGS. 7 and 8 are front and back elevation views of the BLS shown in FIG. 3.

FIGS. 9 and 10 are right and left side elevation views of the BLS shown in FIG. 3.

FIGS. 19 and 20 are front and back elevation views of the BLS shown in FIG. 15.

FIGS. 21 and 22 are right and left side elevation views of the BLS shown in FIG. 15.

Corresponding reference numerals indicate corresponding (although not necessarily identical) parts throughout the several views of the drawings.

DETAILED DESCRIPTION

Figure 1:
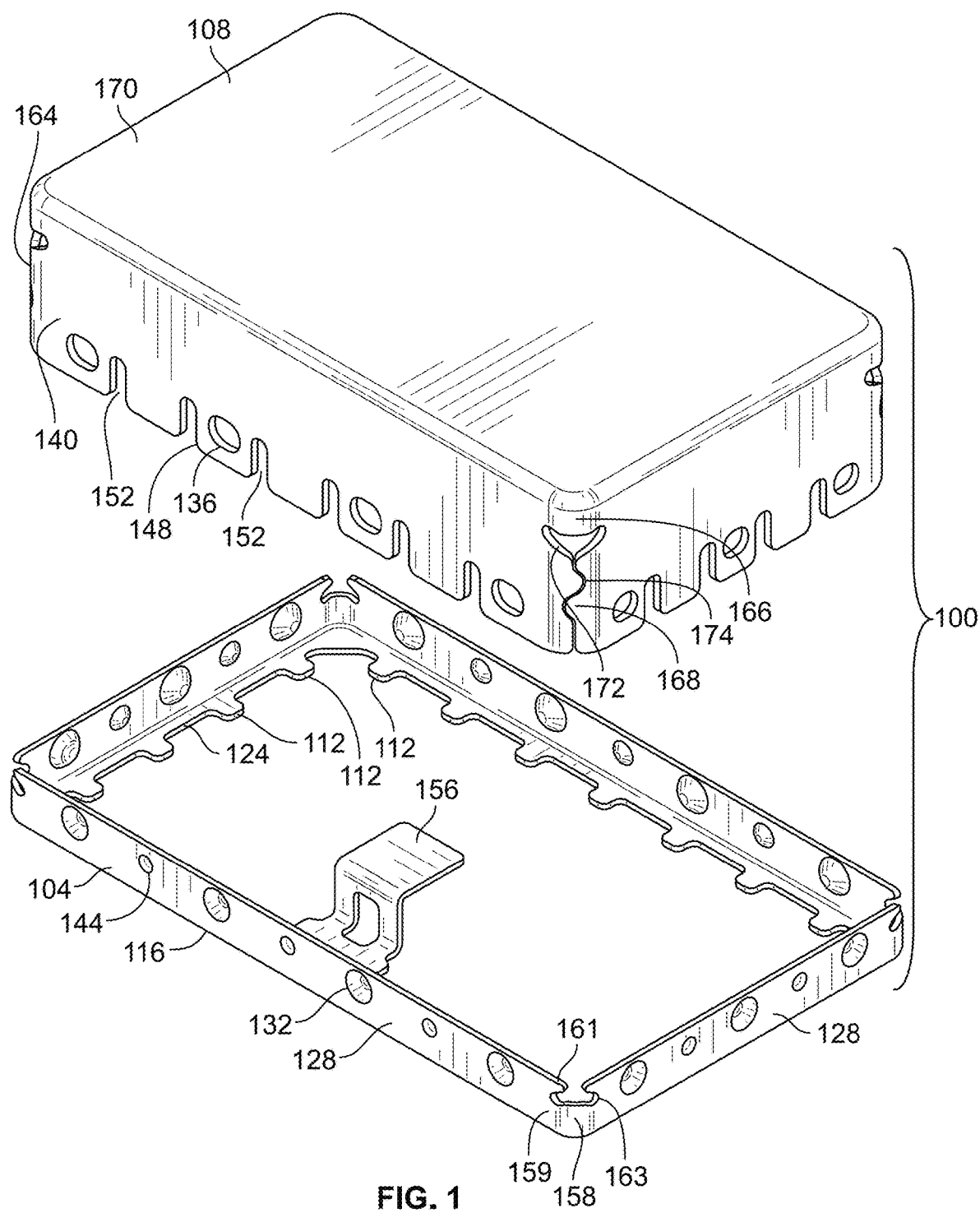
FIGS. 1 and 2 are exploded perspective views of a first exemplary embodiment of a board level shield (BLS) that includes a frame and a cover releasably attachable to, detachable from, and reattachable to the frame.

Example embodiments will now be described more fully with reference to the accompanying drawings.

By way of background, a conventional thermoformed metallized plastic board level shield (BLS) may be attached to a printed circuit board (PCB) using individual BGA (ball grid array) solder balls or spheres. The conventional thermoformed metallized plastic BLS has a single-piece construction without a removable and reattachable cover. The conventional thermoformable metallized plastic BLS thus does not have a reusable cover that may be removed, for example, to allow for reworking and PCB component access (e.g., inspection, repair, etc.) after the BLS has been installed to solder ball pads along the PCB via individual BGA solder balls. Accordingly, the conventional thermoformed metallized plastic BLS is disposable not reusable.

After recognizing the above, exemplary embodiments were developed and are disclosed herein of board level shields (broadly, shields or shielding assemblies). As disclosed herein, the board level shields may be configured to be attachable to solder ball pads (broadly, electrically-conductive portions) along printed circuit boards (broadly, substrates).

In exemplary embodiments, a BLS includes inwardly extending tabs (broadly, portions) configured to be alignable with and solderable to solder ball pads or other electrically-conductive portions along a PCB. The tabs may be configured (e.g., have a predetermined shape, size, location, spacing, etc.) for aligning with solder ball pads according to a preexisting PCB layout, which includes or defines the arrangement or array of the solder ball pads along the PCB.

Accordingly, the BLS may be used with a PCB having the PCB layout without requiring any changes to the PCB layout.

For example, the BLS may be usable as a drop in replacement for a disposable conventional thermoformed metallized plastic BLS described above. In this example, the BLS tabs are configured to be alignable with and solderable to the same arrangement or array (e.g., a ball grid array (BGA), etc.) of solder ball pads to which the disposable conventional thermoformed metallized plastic BLS is solderable or was previously soldered.

In exemplary embodiments, the BLS includes a frame or fence and a cover or lid that is releasably attachable to, detachable from, and reattachable to the frame, such that the cover is reusable, e.g., after rework, etc. For example, the cover may be removed from the frame to allow for reworking and/or PCB component access while the BLS frame remains installed to the PCB. The cover may be releasably attached back onto the frame.

The BLS frame includes the tabs or protruding portions that extend inwardly from and/or that are spaced apart along a bottom portion of the frame. The BLS frame's tabs may be configured (e.g., have a predetermined shape, size, location, spacing, etc.) for aligning with solder ball pads according to a preexisting PCB layout, which includes or defines the arrangement or array (e.g., a ball grid array (BGA), etc.) of the PCB's solder ball pads. The BLS frame may be made of a solderable material (e.g., ½ hard 770 Nickel Silver, other solderable material, etc.) such that the tabs are solderable to the PCB's solder ball pads.

Accordingly, the BLS frame may thus be solderable to a PCB having the preexisting PCB layout without requiring any changes to the PCB layout. And, the BLS frame and cover may be usable as a drop in replacement for a disposable conventional thermoformed metallized plastic BLS described above. In this example, the BLS frame's tabs are configured to be alignable with and solderable to the same arrangement or array of solder ball pads to which the disposable conventional thermoformed metallized plastic BLS is solderable or was previously soldered.

In some exemplary embodiments, the cover may comprise a solid cover with no holes. In some exemplary embodiments, the cover and frame may be attachable such that no holes are visible or apparent after the cover is attached to the frame. In some exemplary embodiments, a separate insert, piece, or member may be coupled (e.g., welded, etc.) to the cover to add a greater Z height to accommodate for taller PCB components under the cover. By way of example, the separate insert may be laser welded to the cover such that a deep draw is not necessary to add the greater Z height in that area.

With reference to the figures, FIGS. 1 through 12 illustrate a first exemplary embodiment of a board level shield (BLS) 100 embodying one or more aspects of the present disclosure. As shown, the BLS 100 includes a frame or fence 104 and a cover or lid 108. The cover 108 is configured to be releasably attachable to, detachable from, and reattachable to the frame 104, such that the cover 108 is reusable, e.g., after rework, etc.

For example, after the frame 104 is soldered to a PCB, the cover 108 may be releasably attached to the frame 104. If reworking and/or other PCB component access becomes necessary, the cover 108 may be detached and removed from the frame 104 to allow reworking and PCB component access through the open top of the frame 104. After the reworking and/or PCB component access is completed, the same cover 108 may then be reused and reattached to the frame 104.

Figure 11:
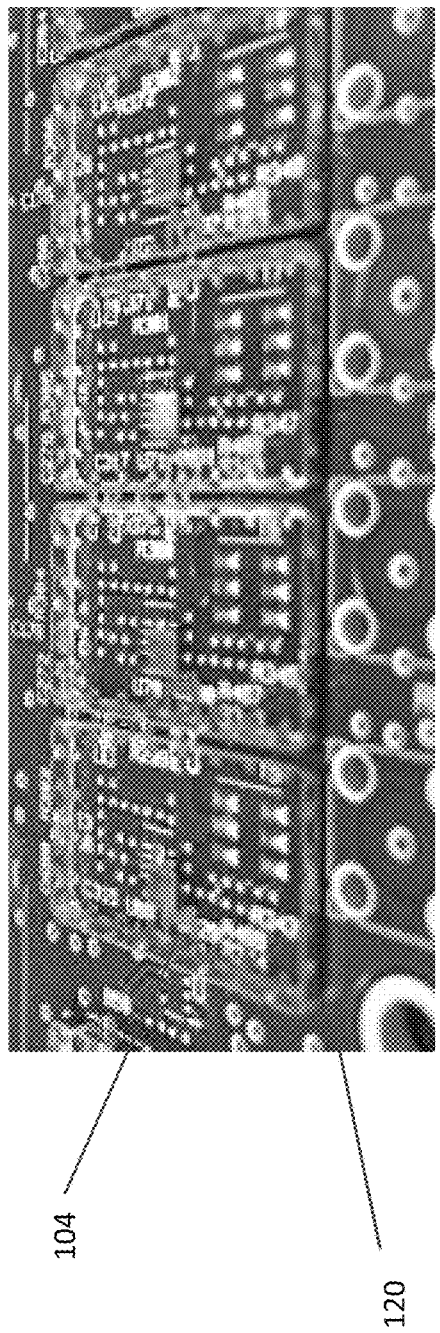
FIG. 11 illustrates BLS frames as shown in FIGS. 1 and 2 mounted on a PCB.
Figure 12:
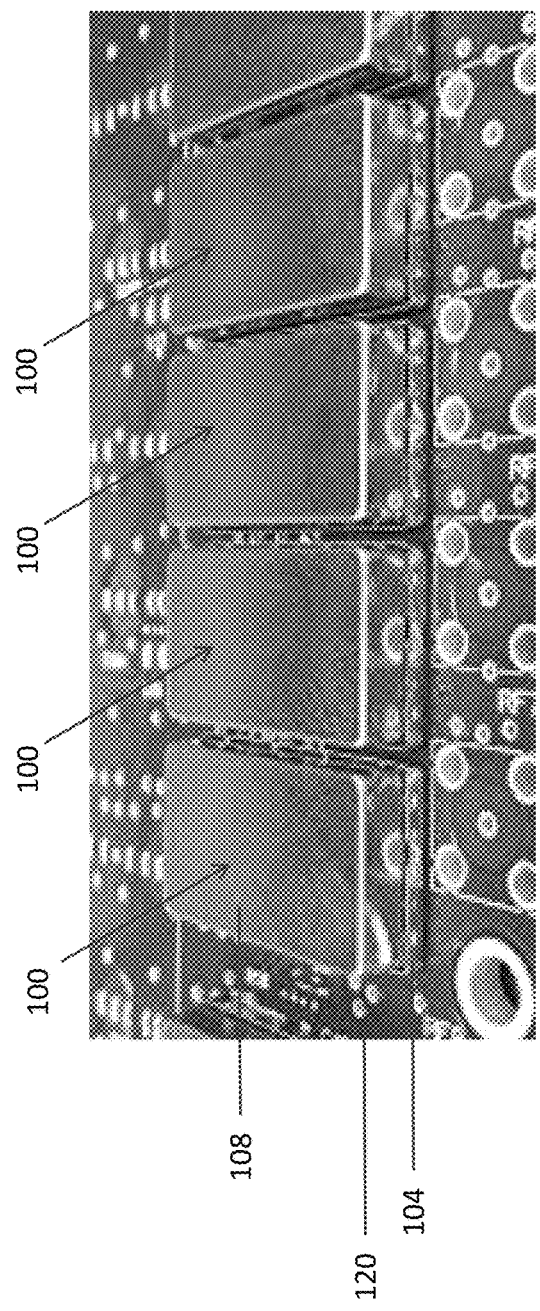
FIG. 12 illustrates BLS covers as shown in FIGS. 1 and 2 releasably attached to the BLS frames.

The frame 104 includes tabs or protruding portions 112 that extend inwardly from and/or that are spaced apart along a bottom portion 116 of the frame 104. The frame's tabs 112 are configured (e.g., shaped, sized, located, spaced apart, etc.) to align with solder ball pads along a PCB 120 (FIG. 11). The frame 104 may be made of a solderable material (e.g., ½ hard 770 Nickel Silver, other solderable material, etc.) such that the tabs 112 are solderable to solder ball pads along the PCB 120.

Figure 2:
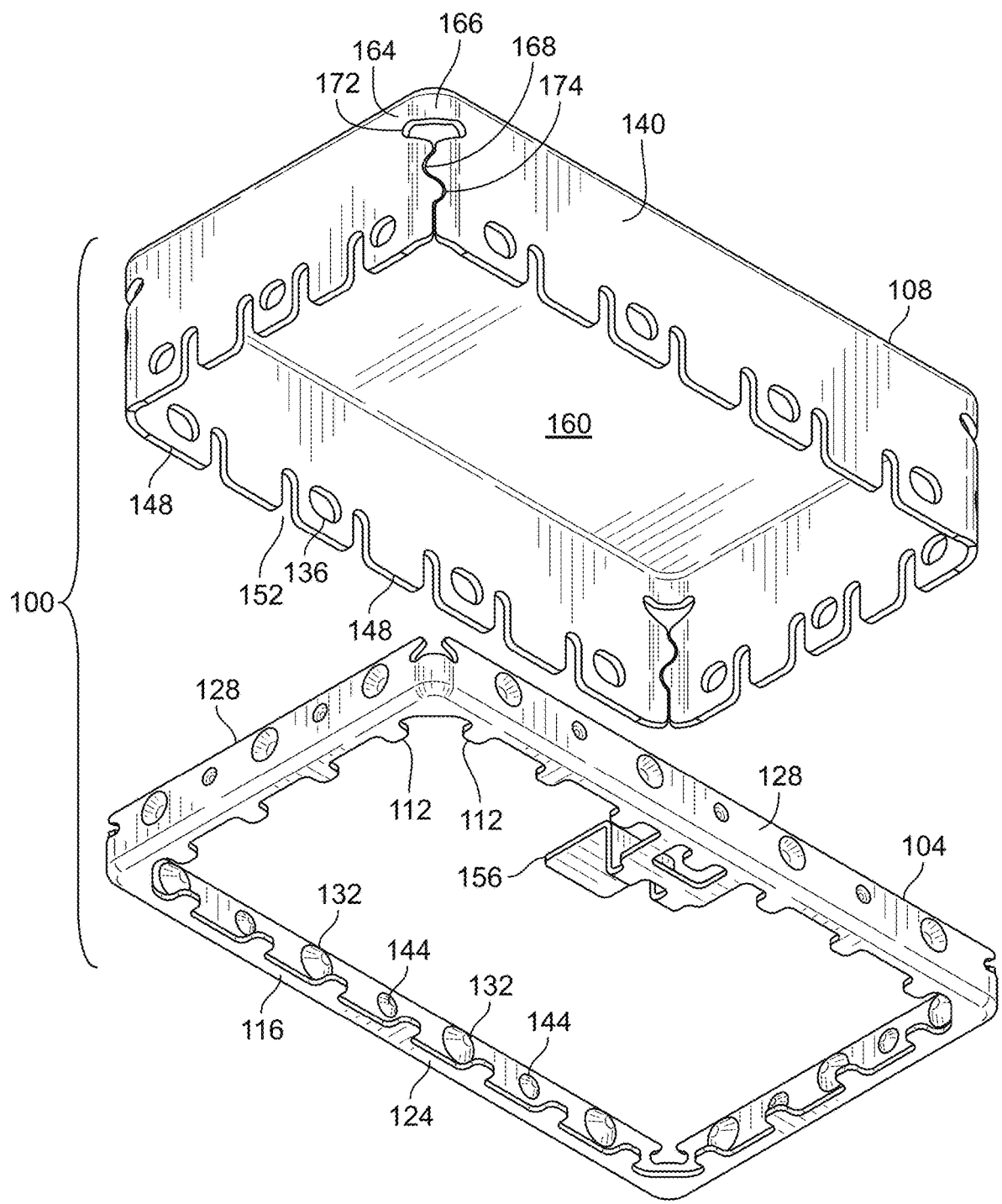
Figure 3:
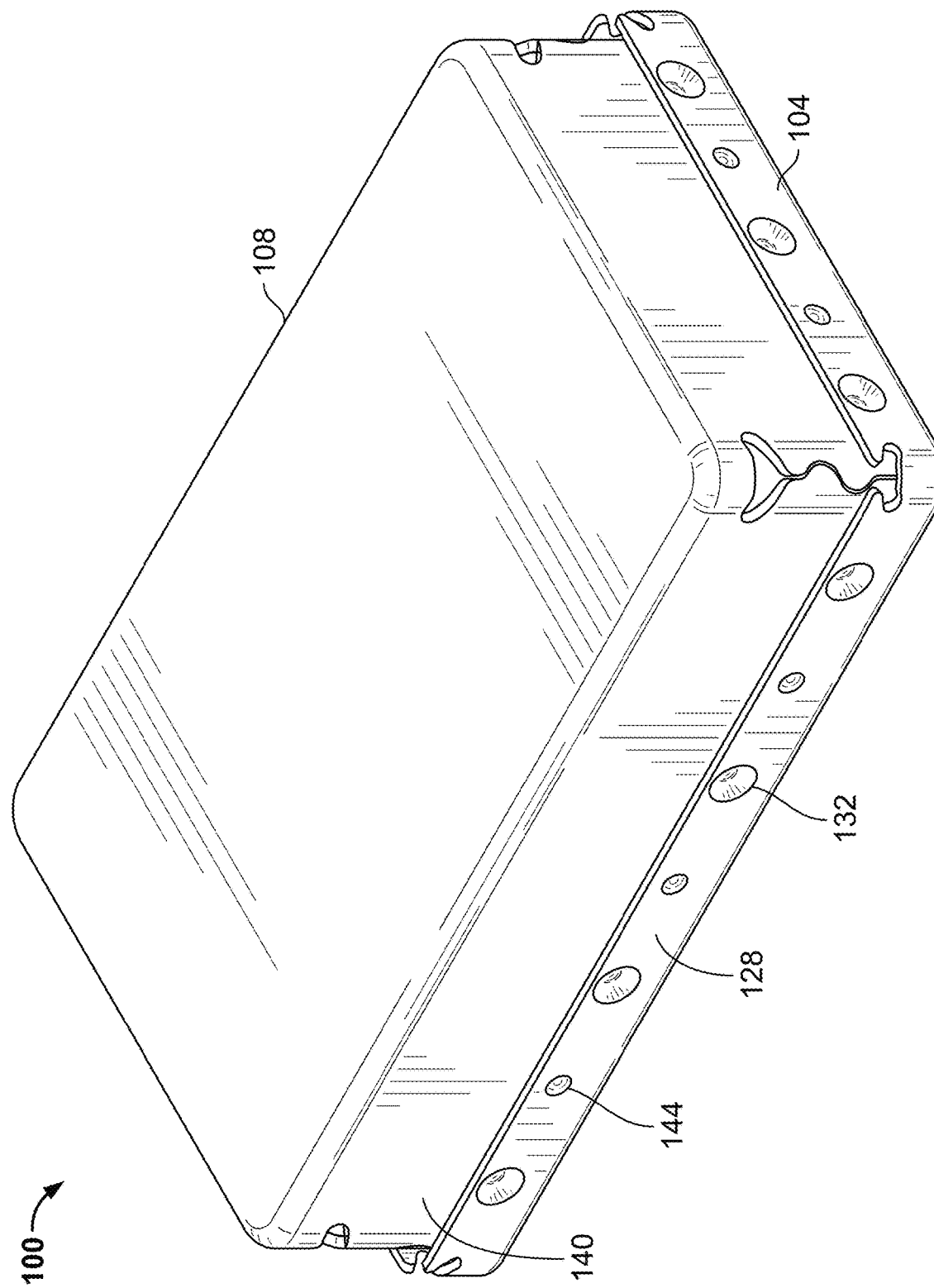
FIGS. 3 and 4 are upper and lower perspective views of the BLS shown in FIGS. 1 and 2 after the cover has been releasably attached to the frame.
Figure 4:
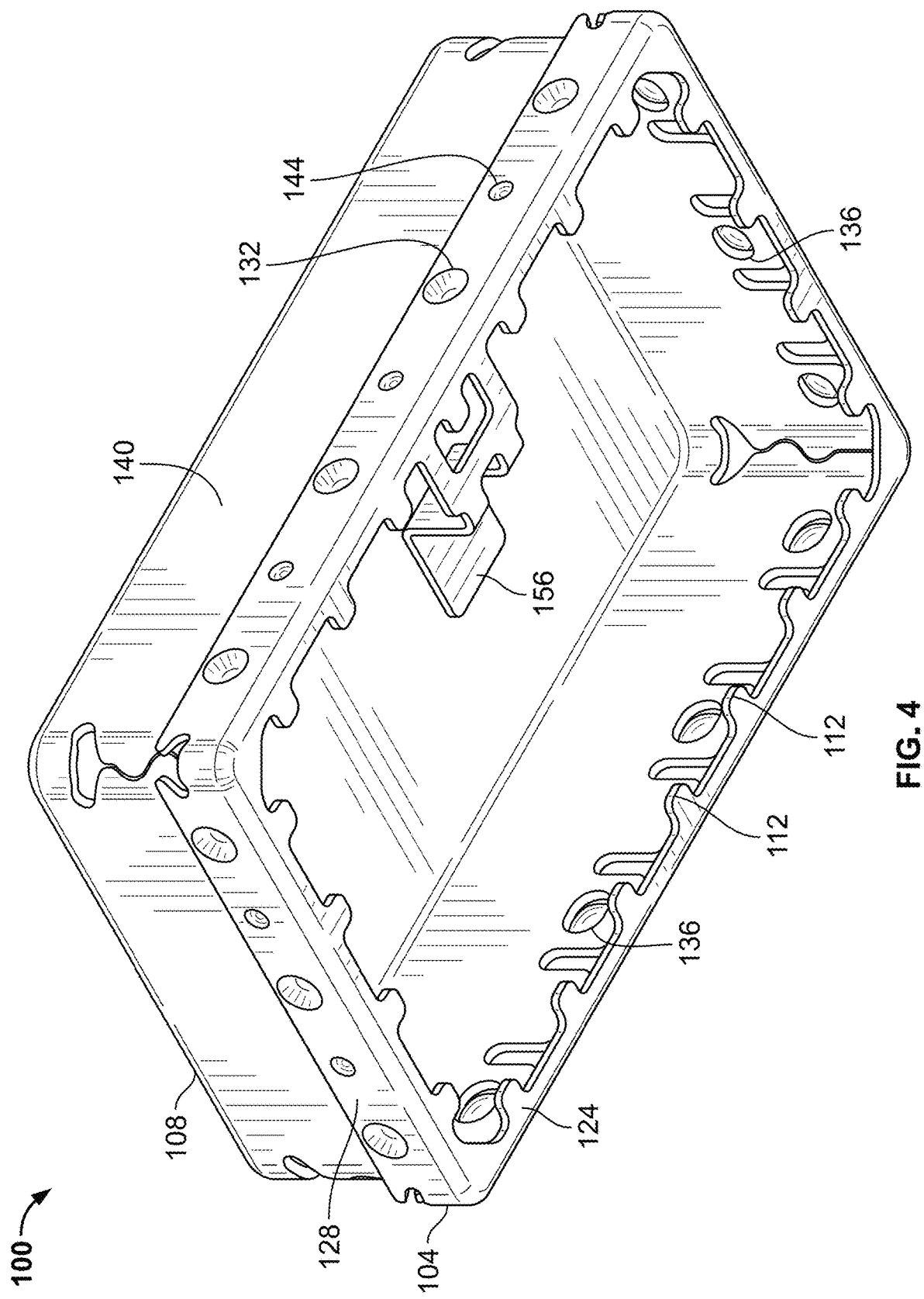
Figure 5:
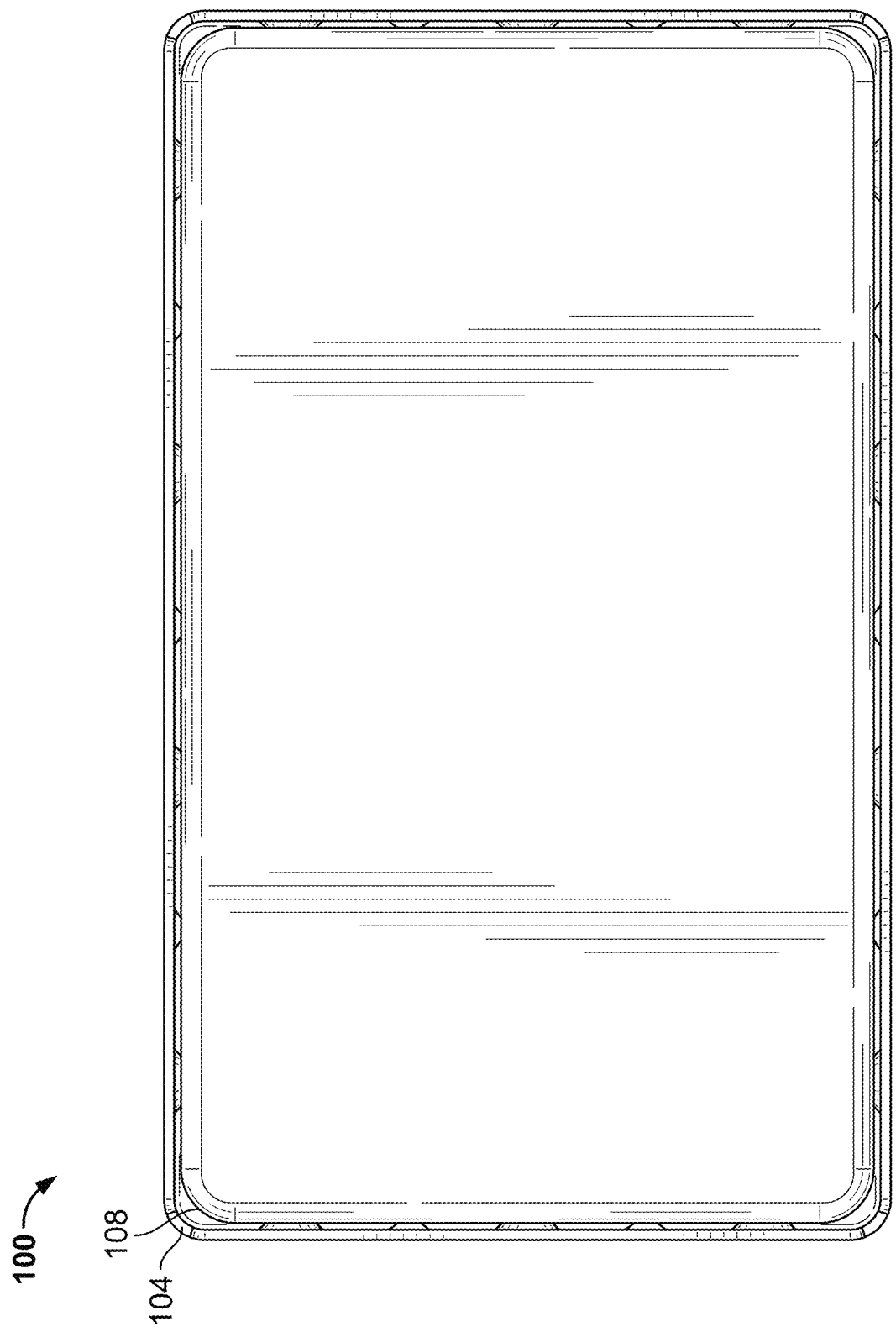
FIGS. 5 and 6 are top and bottom plan views of the BLS shown in FIG. 3.
Figure 6:
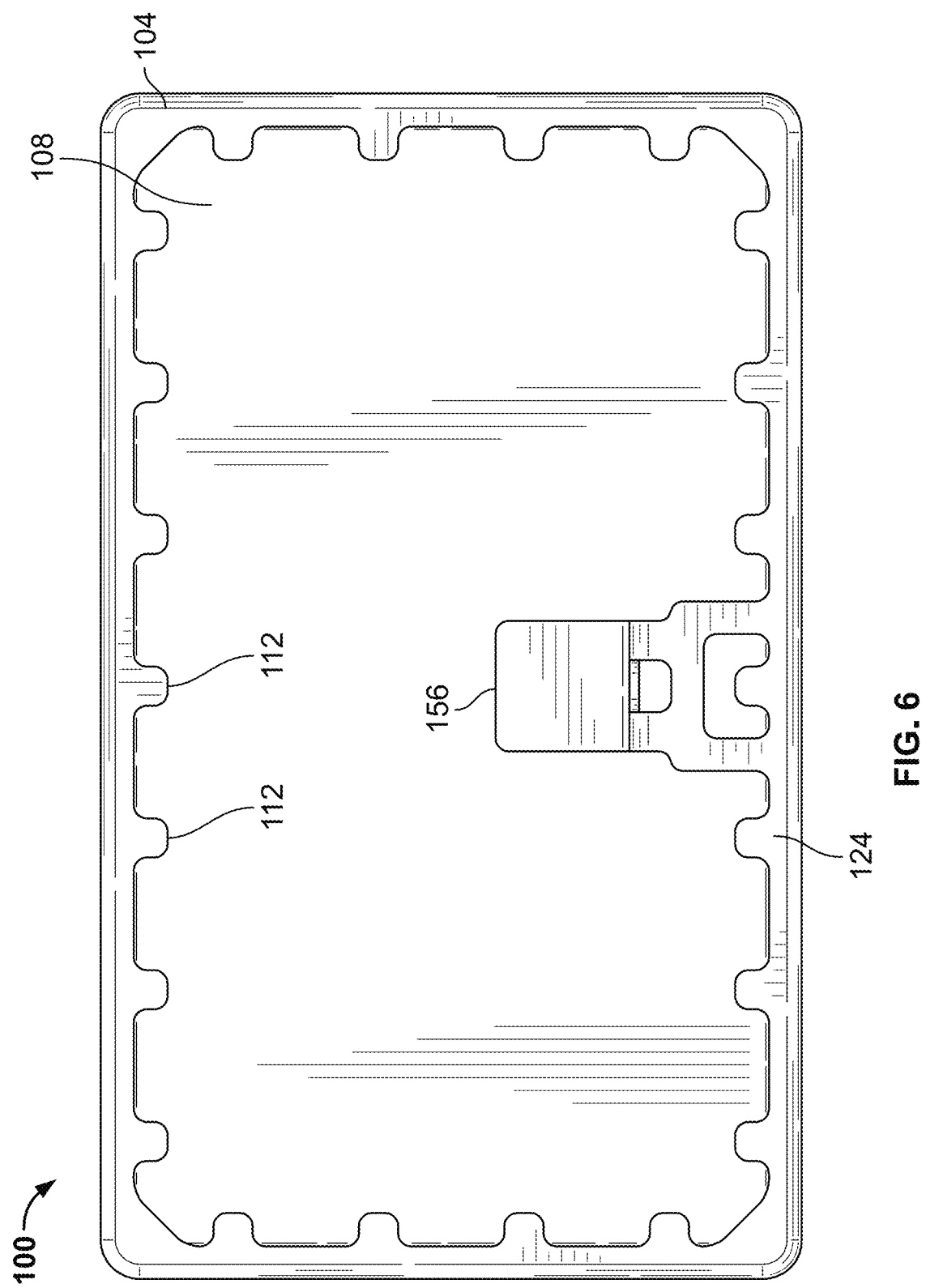

As shown in FIGS. 1 and 2, the frame 104 includes an eave, flange, rim, or lip 124 that extends inwardly from and/or along an inner perimeter defined by the bottom portion 116 of the frame's sidewalls 128. The tabs 112 may extend inwardly from and/or along an inner perimeter defined by the eave, flange, rim, or lip 124.

The frame 104 may be soldered to the PCB 120 via the solderable tabs 112, which may be disposed along and/or define a bottom or bottommost portion of the frame 104. Accordingly, the frame 104 may be mounted "inverted" on the PCB 120 (FIG. 11) as compared to the traditional mounting orientation of a conventional BLS.

By way of background, a conventional BLS frame may have mounting feet along a bottom of the conventional BLS frame and an inwardly extending flange or eave along the top of the conventional BLS frame. The bottom mounting feet may be soldered to a PCB to thereby mount the conventional BLS frame to the PCB. At which point, the inwardly extending flange or eave is along the top of the conventional BLS frame. This is in contrast to exemplary embodiments disclosed herein. For example, the frame's inwardly extending tabs 112 along the inwardly extending flange or eave 124 are usable as the soldering location for soldering the frame 104 to the PCB 120 (FIG. 11). In this exemplary embodiment, the inwardly extending flange or eave 124 is along the bottom of the frame 104 after the frame 104 is mounted "inverted" to the PCB 120 via soldering of the tabs 112 to solder ball pads along the PCB 120.

The frame's tabs 112 may be configured (e.g., have a predetermined shape, size, location, spacing, etc.) for aligning with solder ball pads according to a preexisting PCB layout, which includes or defines the arrangement or array (e.g., a ball grid array (BGA), etc.) of the PCB's solder ball pads. Accordingly, the frame 104 may thus be solderable to a PCB 120 having the preexisting PCB layout without requiring any changes to the PCB layout.

The BLS 100 may be usable as a drop in replacement for a disposable conventional thermoformed metallized plastic BLS described above. In this example, the frame's tabs 112 are configured to be alignable with and solderable to the same arrangement or array of solder ball pads to which the disposable conventional thermoformed metallized plastic BLS is solderable or was previously soldered.

The cover 108 may be manually removable such as by using a tool (e.g., a plastic shim, etc.), etc. Additionally, or alternatively, the cover 108 may be configured to be removable via an at least partially automated process (e.g., without manual intervention, etc.), such as by using suitable pick and place equipment (e.g., a gripper, a pneumatic head, a vacuum pick-and-place head, a suction cup pick-and-place head, etc.).

The cover 108 may be releasably attachable to the frame 104 via dimples 132 and openings 136 configured to engagingly receive the dimples 132. In this exemplary embodiment, the frame's sidewalls 128 include inwardly extending dimples or protrusions 132 (broadly, retention or engagement members). The cover's sidewalls 140 include holes 136 (broadly, openings) configured for engagingly receiving the dimples 132 of the frame 104, to thereby releasably attach the cover 108 to the frame 104. The frame 104 further includes dimples 144 that contact inner surfaces of the cover's sidewalls 140, thereby providing additional electrical contact and a more secure mechanical attachment of the cover 108 to the frame 104. Alternative embodiments may include other suitable means or attachment mechanisms for releasably attaching the cover to the frame instead of or in addition to dimples and holes.

The cover's sidewalls 140 are positionable along the inner surfaces of the corresponding frame's sidewalls 128, such that the cover's openings 136 receive the frame's dimples 132. Accordingly, the attachment of the cover 108 to the frame 104 is inside or within a footprint or outer perimeter defined by the frame 104. The BLS 100 may thus have a relatively small footprint defined by the frame's sidewalls 128. The BLS footprint may be reduced in size as the dimples 132, 144 extend inwardly (not outwardly) from the frame's sidewalls 128 and the cover's sidewalls 140 are positioned interiorly to the frame's sidewalls 128.

The upper surfaces of the frame's dimples 132, 144 may include or be operable as camming surfaces. As the cover 108 is slidably moved downward relatively into the footprint of the frame 104, the camming surfaces may contact the bottom edges of the cover's sidewall portions 148. This contact causes inward flexing or inward movement of the cover's sidewall portions 148, which may have gaps or openings 152 therebetween for increased flexibility. The inward movement of the cover's sidewall portions 148 allows the frame's dimples 132 to slide along the cover's sidewall portions 148 until the dimples 132 are aligned with the holes 136 in the cover's sidewall portions 148. The cover's sidewall portions 148 may then resiliently move, flex, or snap back outwardly to thereby frictionally engage the frame's dimples 132 within the cover's holes 136.

The BLS 100 may be compatible with surface mount technology (SMT). For example, the frame 104 may include a pickup member 156 (and/or electrical contact) that allows the frame 104 to be picked up and placed on a surface of the PCB 120 via suitable pick and place equipment (e.g., a gripper, a pneumatic head, a vacuum pick-and-place head, a suction cup pick-and-place head, etc.). The frame 104 may be placed onto the PCB 120 such that the frame's tabs 112 are aligned with and solderable to solder ball pads along the PCB 120.

The frame's pickup/electrical contact member 156 extends upwardly relative to (e.g., from, etc.) a bottom of the frame 104. The pickup/electrical contact member 156 may be configured (e.g., shaped, sized, located, etc.) to make electrical contact with an inner surface or underside 160 of the cover 108. The additional electrical contact provided between the pickup/electrical contact member 156 and the cover's underside 160 is not necessarily required for all embodiments. In an exemplary embodiment, the pickup/electrical contact member 156 may extend upwardly above a top of the frame's sidewalls 128. When the cover 108 is releasably attached to the frame 104, the cover's underside 160 may contact and cause the pickup/electrical contact member 156 to flex or compress downwardly. The pickup/electrical contact member 156 may be resiliently flexible such that the resilient nature of the pickup/electrical contact member 156 biases the pickup/electrical contact member 156 to return to its original position. This, in turn, may help ensure that the pickup/electrical contact member 156 makes good electrical contact with the underside 160 of the cover 108 and/or also help maintain a good continuous locking attachment between the cover 108 and the frame 104. For example, the downwardly flexed or compressed pickup/electrical contact member 156 may apply upward pressure against the underside 160 of the cover 108, which may help to inhibit rattling or vibration of the cover 108 and/or may help provide generally continuous locking of the cover 108 to the frame 104 even though the cover 108 includes sidewall portions 148 (e.g., individual fingers, etc.) having gaps therebetween 152.

The frame 104 includes the inwardly extending flange 124 along the bottom that is placed onto the PCB 120. As shown in FIGS. 1 and 2, the frame 104 does not include an inwardly extending flange along the top of the frame 104. The frame 104 may thus provide more access (e.g., maximum access, etc.) to PCB components through the open top of the frame 104 as compared to a conventional BLS frame having an inwardly extending flange, eave, or overhang along the top of the conventional BLS frame. The presence of the inwardly extending flange along the top of the conventional BLS frame may impede or limit access to the PCB components as the inwardly extending flange reduces the size of the open top of the conventional BLS frame.

With continued reference to FIGS. 1 and 2, each frame sidewall 128 may be generally continuous, unbroken, and/or not include any gaps or openings between two portions of the same sidewall 128. The frame 104 may be formed from a single piece of electrically-conductive material (e.g., single blank of material, etc.) such that the frame 104 (e.g., sidewalls 128, tabs 112, inwardly extending flange 124, pickup/electric contact member 156, dimples 132, 144, etc.) has an integral, monolithic, single-piece construction.

For example, a flat profile pattern for the frame 104 and portions thereof (e.g., sidewalls 128, tabs 112, inwardly extending flange 124, pickup/electric contact member 156, dimples 132, 144, corner sections 158, etc.) may be stamped into a piece of material. The frame's sidewalls 128 and pickup/electrical contact member 156 may then be formed, bent, drawn, shaped, folded, etc. Even though the frame 104 may be integrally formed (e.g., stamping and bending/folding/drawing, etc.) from the same piece of material substantially simultaneously in this example, such is not required for all embodiments.

By way of example only, the frame 104 may include corner sections 158 (FIG. 1) similar to or substantially identical to the corner sections of the frames as disclosed in U.S. Pat. No. 7,488,902, the contents of which is incorporated herein. For example, each corner section 158 of the frame 104 may include a drawn portion 159 and a folded portion 161 formed by side edge portions of adjacent sidewalls 128 of the frame 104. The drawn portion 159 and the folded portion 161 may be generally rounded in shape.

The drawn portion 159 integrally connects the frame's adjacent sidewalls 128 and flange 124. The sidewalls 128 and drawn portion 159 depend generally upwardly relative to the flange 124.

The folded portion 161 is located generally above the drawn portion 159. The folded portion 161 is defined by side edge portions of the adjacent sidewalls 128. An opening 163 is located between and cooperatively defined by the drawn portion 159 and the folded portion 161 such that the opening 163 generally separates the drawn portion 159 and the folded portion 161 of the corner section 158. In addition, the frame 104 and its drawn corner sections 158 is but one example of a frame that may be used as other exemplary embodiments may include a differently configured frame.

The cover 108 may be formed from a single piece of electrically-conductive material (e.g., single blank of material, etc.) such that the cover 108 (e.g., sidewalls 140, sidewall portions 148, corner sections 164, etc.) has an integral, monolithic, single-piece construction. For example, a flat profile pattern for the cover 108 and portions thereof (e.g., sidewalls 140, sidewall portions 148, openings 136, 152, etc.) may be stamped into a piece of material. The cover's sidewalls 140 may then be formed, bent, drawn, shaped, folded, etc. Even though the cover 108 may be integrally formed (e.g., stamping and bending/folding/drawing, etc.) from the same piece of material substantially simultaneously in this example, such is not required for all embodiments.

By way of example only, the cover 108 may include corner sections 164 similar to or substantially identical to the corner sections as disclosed in U.S. Pat. No. 7,488,902, the contents of which is incorporated herein. For example, each corner section 164 of the cover 108 may include a drawn portion 166 and a folded portion 168 formed by interconnection of the side edge portions of adjacent sidewalls 140. The drawn portion 166 and the folded portion 168 may be generally rounded in shape.

The drawn portion 166 integrally connects the adjacent side walls 140 and upper or top surface 170 of the cover 108. The sidewalls 140 and drawn portion 166 depend generally downwardly relative to the cover's upper surface 170.

The folded portion 168 is located generally below the drawn portion 166. The folded portion 168 is defined by interlocking side edge portions of the adjacent sidewalls 140 such that a seam 174 is formed thereby. An opening 172 is located between and cooperatively defined by the drawn portion 166 and the folded portion 168 such that the opening 172 generally separates the drawn portion 136 and the folded portion 168 of the corner section 164.

As shown in FIGS. 1 and 2, the seam 174 extends the length of the folded portion 168 of the corner section 164. In other exemplary embodiments, the seam 174 may extend only part of the length of the folded portion 168. In still other exemplary embodiments, the opening 172 may be located differently than illustrated in the figures. For example, alternative embodiments may not include any openings in the cover's corner sections 164. In further embodiments, one or more openings 172 may be additionally or alternatively located along the length of the folded portion 168. In addition, the cover 108 and its drawn corner sections 164 is but one example of a cover that may be used as other exemplary embodiments may include a differently configured cover.

FIGS. 13 through 22 illustrate a second exemplary embodiment of a board level shield (BLS) 200 embodying one or more aspects of the present disclosure. As shown, the BLS 200 includes a frame or fence 204 and a cover or lid 208. The cover 208 is configured to be releasably attachable to, detachable from, and reattachable to the frame 204, such that the cover 208 is reusable, e.g., after rework, etc.

For example, after the frame 204 is soldered to a PCB, the cover 208 may be releasably attached to the frame 204. If reworking and/or other PCB component access becomes necessary, the cover 208 may be detached and removed from the frame 204 to allow reworking and PCB component access through the open top of the frame 204. After the reworking and/or PCB component access is completed, the same cover 208 may then be reused and reattached to the frame 204.

The frame 204 includes tabs or protruding portions 212 that extend inwardly from and/or that are spaced apart along a bottom portion 216 of the frame 204. The frame's tabs 212 are configured (e.g., shaped, sized, located, spaced apart, etc.) to align with solder ball pads along a PCB 120 (FIG. 21). The frame 204 may be made of a solderable material (e.g., ½ hard 770 Nickel Silver, other solderable material, etc.) such that the tabs 212 are solderable to solder ball pads along a PCB.

Figure 13:
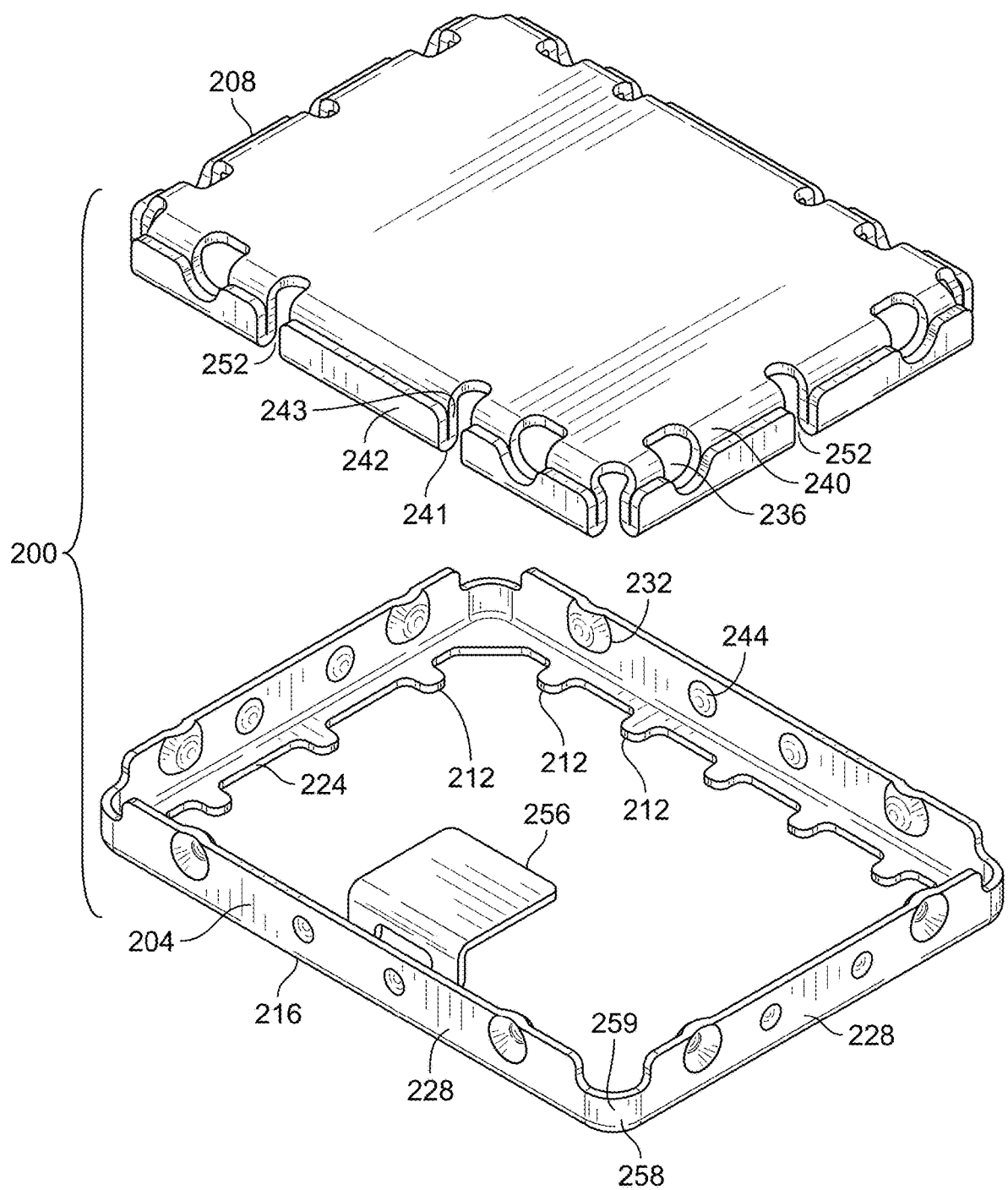
FIGS. 13 and 14 are exploded perspective views of a second exemplary embodiment (e.g., having a lower profile, etc.) of a board level shield (BLS) that includes a frame and a cover releasably attachable to, detachable from, and reattachable to the frame.
Figure 14:
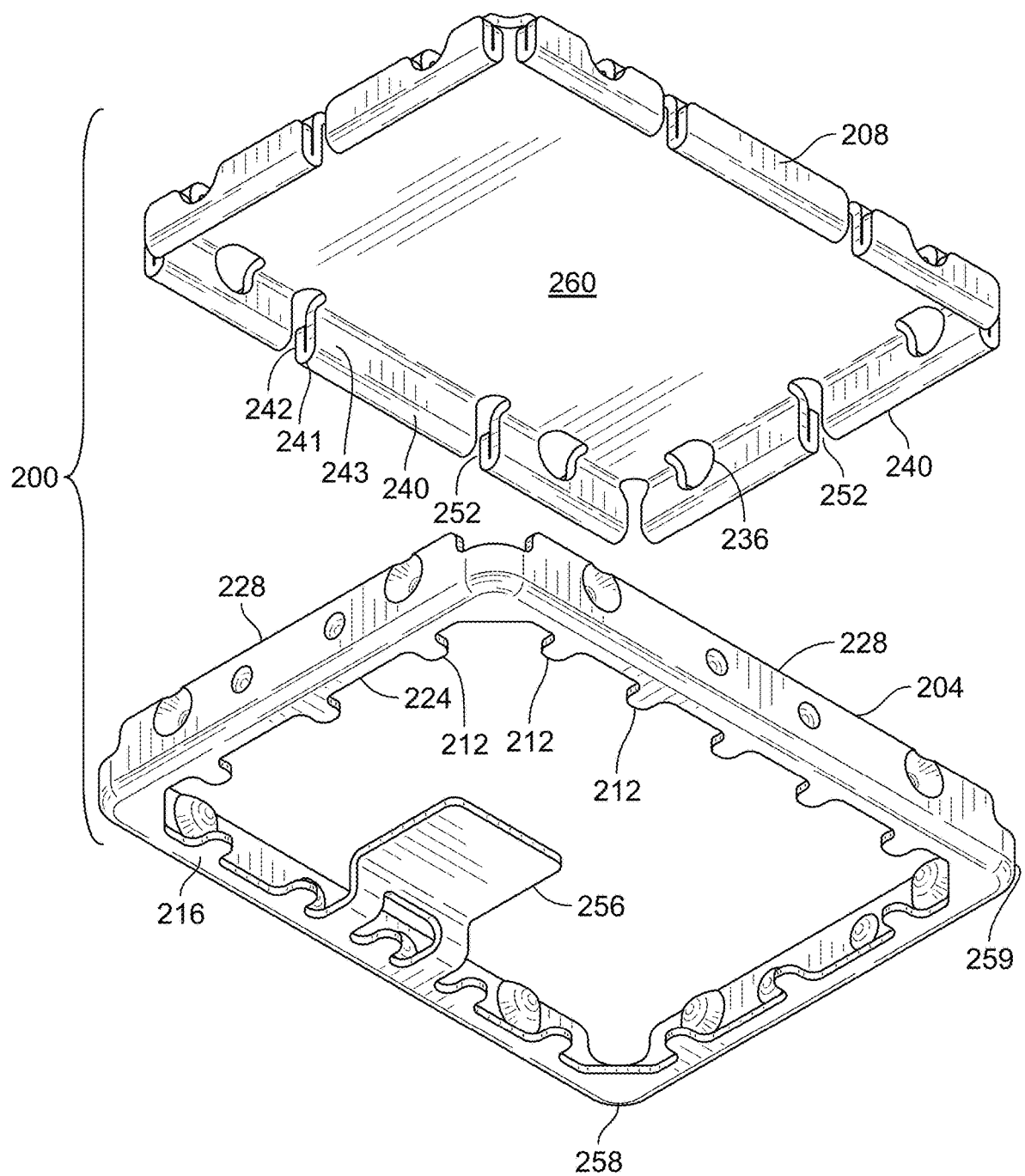
Figure 15:
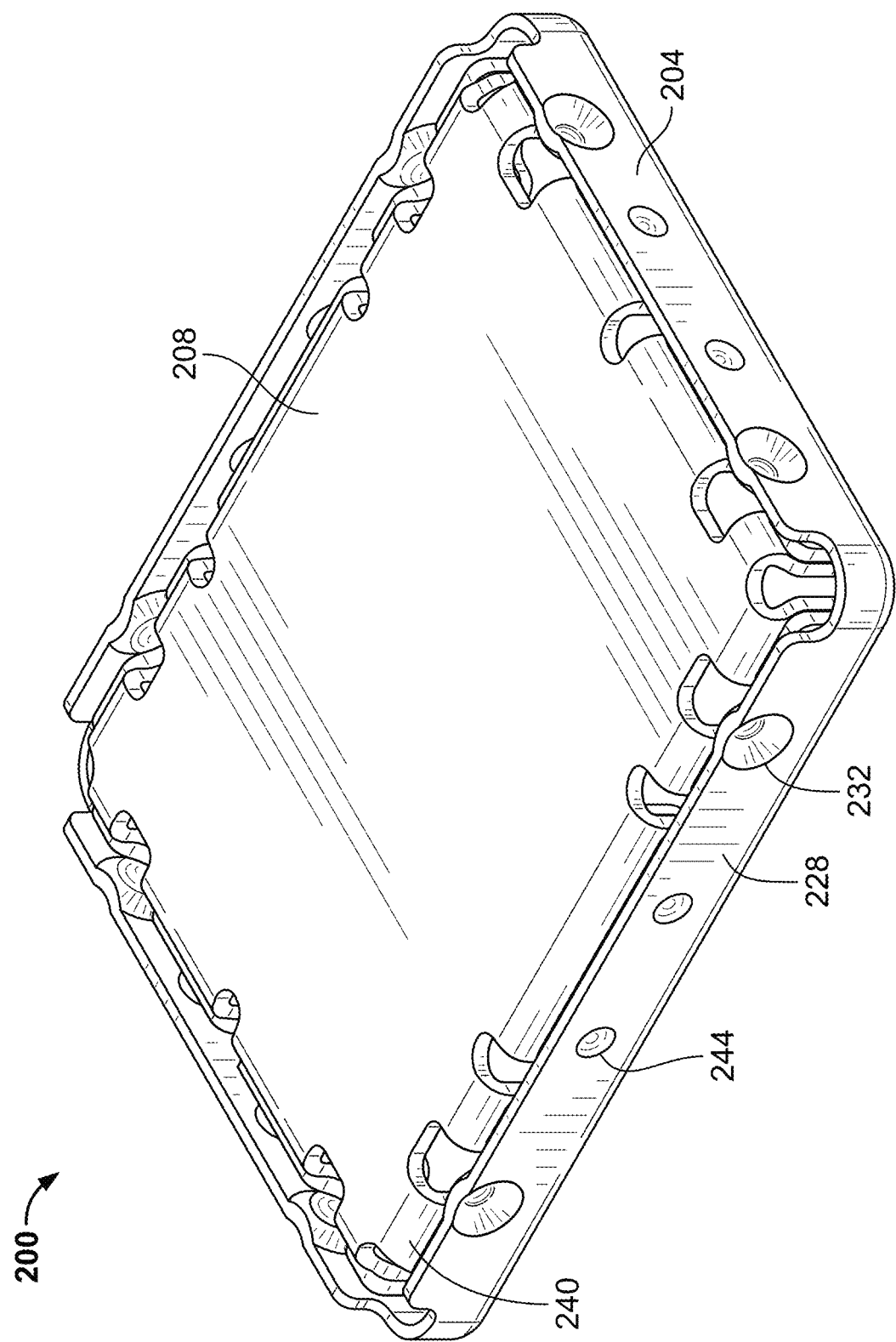
FIGS. 15 and 16 are upper and lower perspective views of the BLS shown in FIGS. 13 and 14 after the cover has been releasably attached to the frame.
Figure 16:
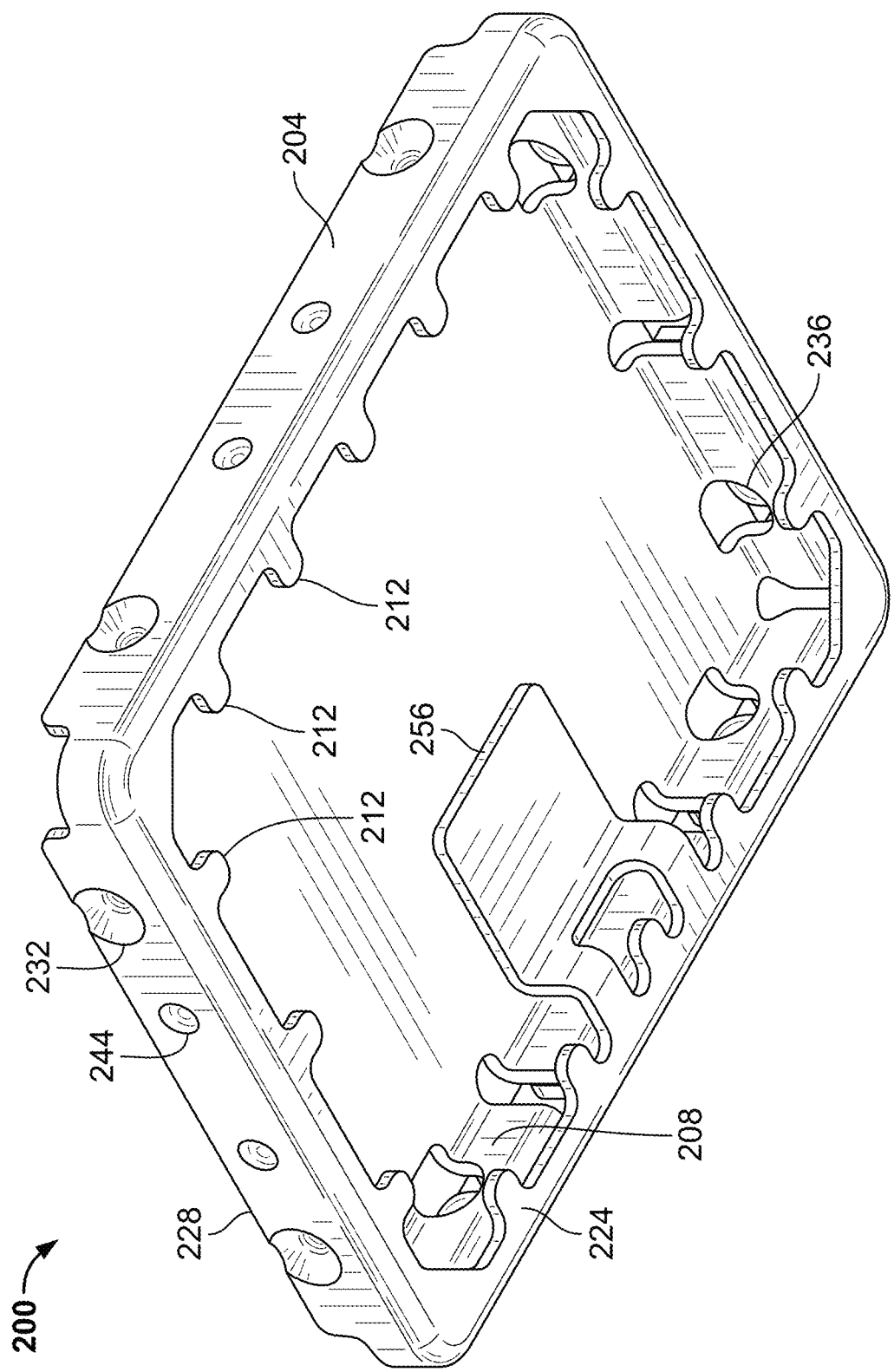
Figure 17:
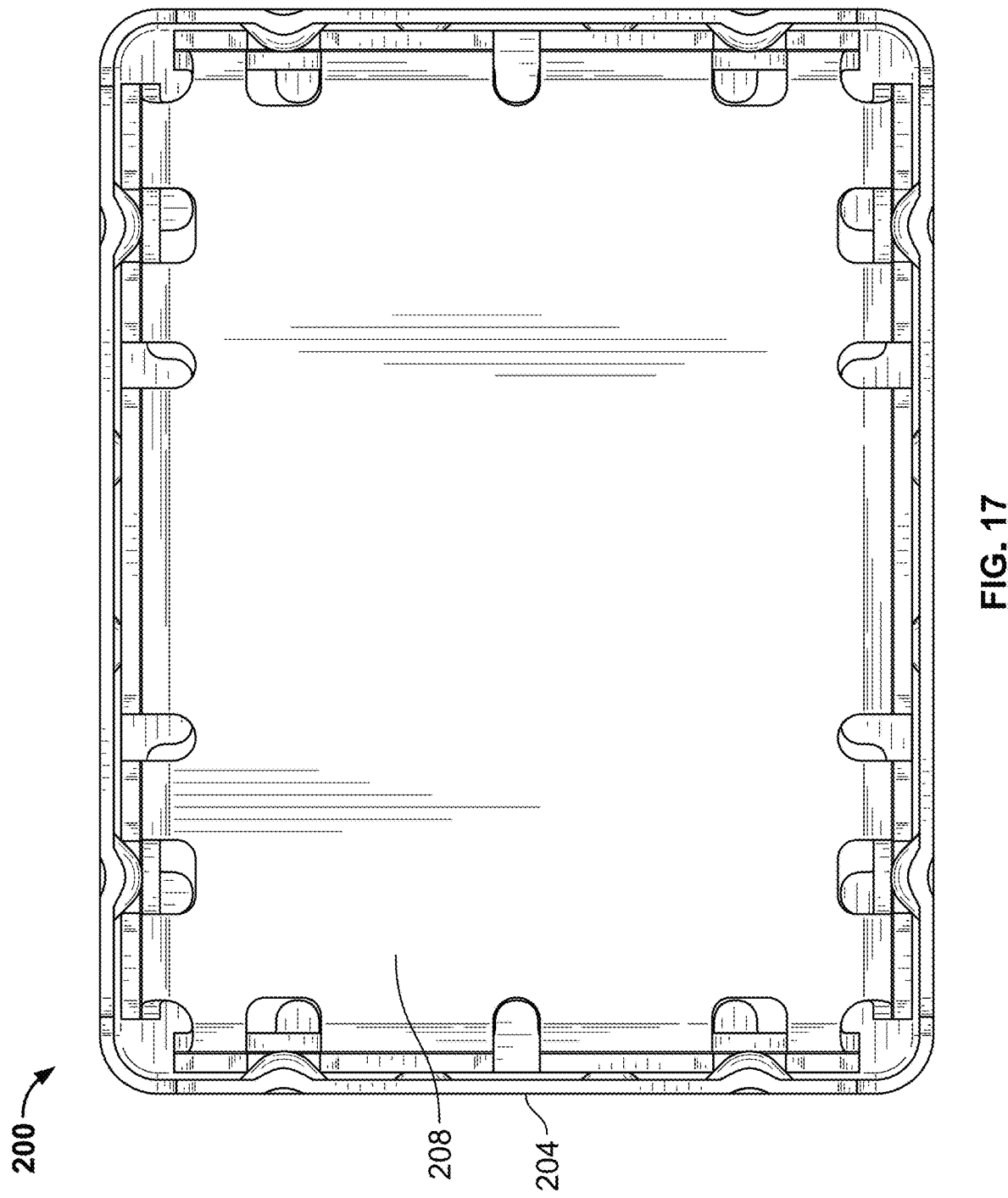
FIGS. 17 and 18 are top and bottom plan views of the BLS shown in FIG. 15.
Figure 18:
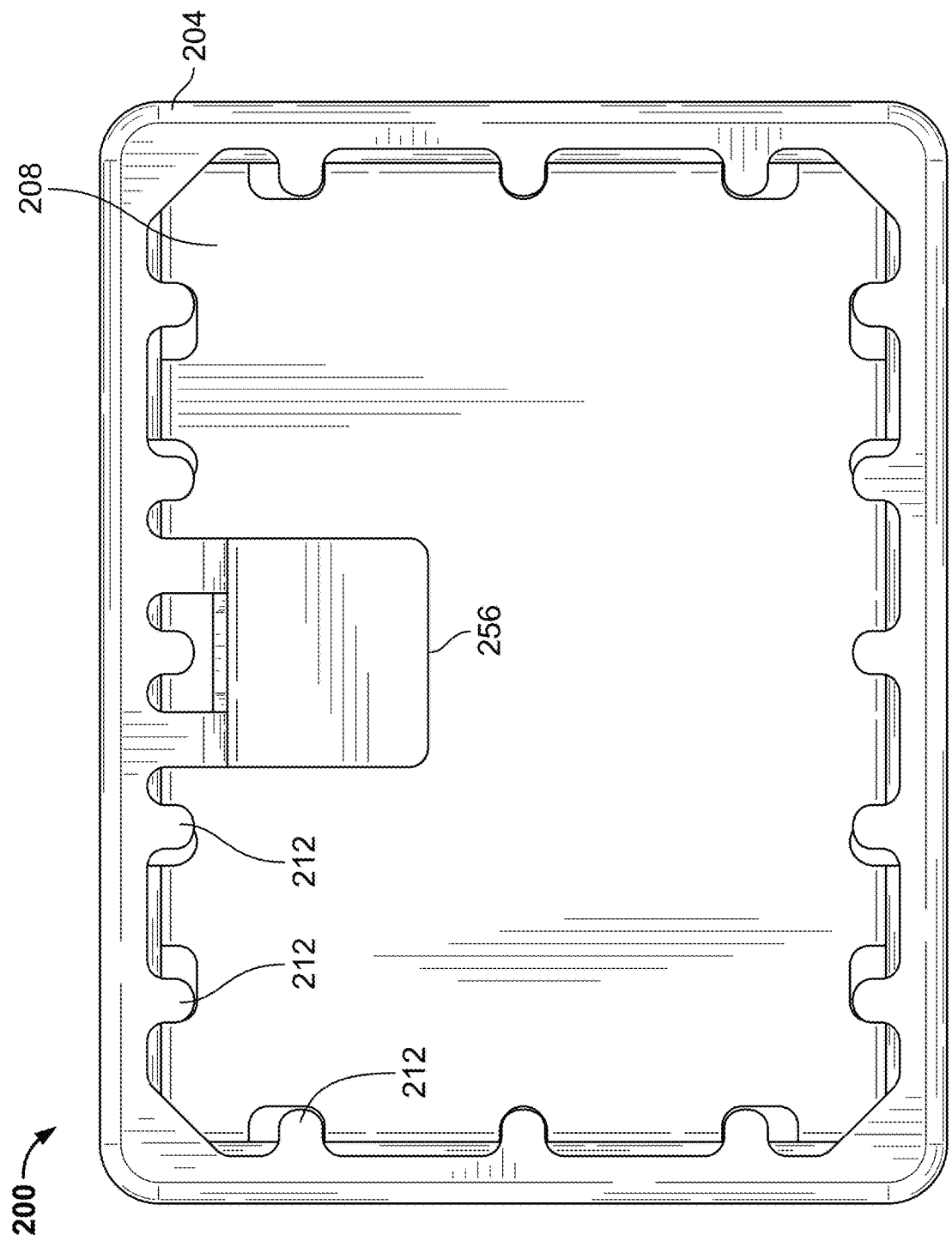

As shown in FIGS. 13 and 14, the frame 204 includes a flange, rim, or lip 224 that extends inwardly from and/or along an inner perimeter defined by the bottom portion 216 of the frame's sidewalls 228. The tabs 212 may extend inwardly from and/or along an inner perimeter defined by the flange, rim, or lip 224. The frame 204 may be soldered to a PCB via the solderable tabs 212, which may be disposed along and/or define a bottom or bottommost portion of the frame 204. Accordingly, the frame 204 may be mounted "inverted" on a PCB as compared to the traditional mounting orientation of a conventional BLS.

The frame's tabs 212 may be configured (e.g., have a predetermined shape, size, location, spacing, etc.) for aligning with solder ball pads according to a preexisting PCB layout, which includes or defines the arrangement or array (e.g., a ball grid array (BGA), etc.) of the PCB's solder ball pads. Accordingly, the frame 204 may thus be solderable to a PCB having the preexisting PCB layout without requiring any changes to the PCB layout.

The BLS 200 may be usable as a drop in replacement for a disposable conventional thermoformed metallized plastic BLS described above. In this example, the frame's tabs 212 are configured to be alignable with and solderable to the same arrangement or array of solder ball pads to which the disposable conventional thermoformed metallized plastic BLS is solderable or was previously soldered.

The cover 208 may be manually removable such as by using a tool (e.g., a plastic shim, etc.), etc. Additionally, or alternatively, the cover 208 may be configured to be removable via an at least partially automated process (e.g., without manual intervention, etc.), such as by using suitable pick and place equipment (e.g., a gripper, a pneumatic head, a vacuum pick-and-place head, a suction cup pick-and-place head, etc.).

The cover 208 may be releasably attachable to the frame 204 via dimples 232 and openings 236 configured to engagingly receive the dimples 232. In this exemplary embodiment, the frame's sidewalls 228 include inwardly extending dimples or protrusions 232 (broadly, retention or engagement members). The cover's sidewalls 240 include holes 236 (broadly, openings) configured for engagingly receiving the dimples 232 of the frame 204, to thereby releasably attach the cover 208 to the frame 204. The frame 204 further includes dimples 244 that contact inner surfaces of the cover's sidewalls 240, thereby providing additional electrical contact and a more secure mechanical attachment of the cover 208 to the frame 204. As described above for the dimples 132, 144 of frame 100, the upper surfaces of the dimples 232, 244 of the frame 204 may also include or be operable as camming surfaces. Alternative embodiments may include other suitable means or attachment mechanisms for releasably attaching the cover to the frame instead of or in addition to dimples and holes.

As shown in FIGS. 13 and 14, each cover sidewall 240 includes a folded, bent, or formed portion 241 that provides the sidewall 240 with outer and inner sidewall portions 242, 243. The outer sidewall portion 242 overlaps a lower portion of the inner sidewall portion 243.

The formed portion 241 may also provide a camming surface to facilitate assembly of the cover 208 into the frame 204. For example, as the cover 208 is slidably moved downward relatively into the footprint of the frame 204, the formed portion 241 may contact the top edges of the frame's sidewalls 228. This contact may causes inward flexing or inward movement of the cover's sidewalls 240, which may have gaps or openings 252 along the sidewalls 240 for increased flexibility.

The cover's sidewalls 240 are positionable along the inner surfaces of the corresponding frame's sidewalls 228, such that the cover's openings 236 receive the frame's dimples 232. Accordingly, the attachment of the cover 208 to the frame 204 is inside or within a footprint or outer perimeter defined by the frame 204. The BLS 200 may thus have a relatively small footprint defined by the frame's sidewalls 228. The BLS footprint may be reduced in size as the dimples 232, 244 extend inwardly (not outwardly) from the frame's sidewalls 228 and the cover's sidewalls 240 are positioned interiorly to the frame's sidewalls 228.

The BLS 200 may be compatible with surface mount technology (SMT). For example, the frame 204 may include a pickup member 256 (and/or electrical contact) that allows the frame 204 to be picked up and placed on a surface of a PCB via suitable pick and place equipment (e.g., a gripper, a pneumatic head, a vacuum pick-and-place head, a suction cup pick-and-place head, etc.). The frame 204 may be placed onto a PCB such that the frame's tabs 212 are aligned with and solderable to solder ball pads along the PCB.

The frame's pickup/electrical contact member 256 extends upwardly relative to (e.g., from, etc.) a bottom of the frame 204. The pickup/electrical contact member 256 may be configured (e.g., shaped, sized, located, etc.) to make electrical contact with an inner surface or underside 260 of the cover 208. The additional electrical contact provided between the pickup/electrical contact member 256 and the cover's underside 260 is not necessarily required for all embodiments. In an exemplary embodiment, the pickup/electrical contact member 256 may extend upwardly above a top of the frame's sidewalls 228. When the cover 208 is releasably attached to the frame 204, the cover's underside 260 may contact and cause the pickup/electrical contact member 256 to flex or compress downwardly. The pickup/electrical contact member 256 may be resiliently flexible such that the resilient nature of the pickup/electrical contact member 256 biases the pickup/electrical contact member 256 to return to its original position. This, in turn, may help ensure that the pickup/electrical contact member 256 makes good electrical contact with the underside 260 of the cover 208 and/or also help maintain a good continuous locking attachment between the cover 208 and the frame 204.

The frame 204 includes the inwardly extending flange 224 along the bottom that is placed onto a PCB. As shown in FIGS. 13 and 14, the frame 204 does not include an inwardly extending flange along the top of the frame 204. The frame 204 may thus provide more access (e.g., maximum access, etc.) to PCB components through the open top of the frame 204 as compared to a conventional BLS frame having an inwardly extending flange, eave, or overhang along the top of the conventional BLS frame. The presence of the inwardly extending flange along the top of the conventional BLS frame may impede or limit access to the PCB components as the inwardly extending flange reduces the size of the open top of the conventional BLS frame.

With continued reference to FIGS. 13 and 14, each frame sidewall 228 may be generally continuous, unbroken, and/or not include any gaps or openings between two portions of the same sidewall 228. The frame 204 may be formed from a single piece of electrically-conductive material (e.g., single blank of material, etc.) such that the frame 204 (e.g., sidewalls 228, tabs 212, inwardly extending flange 224, pickup/electric contact member 256, dimples 232, 244, etc.) has an integral, monolithic, single-piece construction.

For example, a flat profile pattern for the frame 204 and portions thereof (e.g., sidewalls 228, tabs 212, inwardly extending flange 224, pickup/electric contact member 256, dimples 232, 244, corner sections 258, etc.) may be stamped into a piece of material. The frame's sidewalls 228 and pickup/electrical contact member 256 may then be formed, bent, drawn, shaped, folded, etc. Even though the frame 204 may be integrally formed (e.g., stamping and bending/folding/drawing, etc.) from the same piece of material substantially simultaneously in this example, such is not required for all embodiments.

By way of example only, the frame 204 may include corner sections 258 (FIG. 13) similar to or substantially identical to the corner sections of the frames as disclosed in U.S. Pat. No. 7,488,902, the contents of which is incorporated herein. For example, each corner section 258 of the frame 204 may include a drawn portion 259. The drawn portion 159 may be generally rounded in shape. The drawn portion 259 integrally connects the frame's adjacent sidewalls 228 and flange 224. The sidewalls 228 and drawn portion 259 depend generally upwardly relative to the flange 224. The frame 204 and its drawn corner sections 258 is but one example of a frame that may be used as other exemplary embodiments may include a differently configured frame.

The cover 208 may be formed from a single piece of electrically-conductive material (e.g., single blank of material, etc.) such that the cover 208 (e.g., sidewalls 240, inner and outer sidewall portions 242, 243, etc.) has an integral, monolithic, single-piece construction. For example, a flat profile pattern for the cover 208 and portions thereof (e.g., sidewalls 240, inner and outer sidewall portions 242, 243, openings 236, etc.) may be stamped into a piece of material. The cover's sidewalls 240 may then be formed, bent, drawn, shaped, folded, etc. Even though the cover 208 may be integrally formed (e.g., stamping and bending/folding/drawing, etc.) from the same piece of material substantially simultaneously in this example, such is not required for all embodiments.

A wide range of electrically-conductive materials may be used to form a frame disclosed herein (e.g., frame 104, frame 204, etc.). For example, a frame may be made of a solderable material (e.g., ½ hard 770 Nickel Silver, etc.), nickel plated aluminum alloy, tin plated aluminum alloy, cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

A wide range of electrically-conductive materials may be used to form a cover disclosed herein (e.g., cover 108, cover 208, etc.) such as nickel plated aluminum alloy, tin plated aluminum alloy, cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

In exemplary embodiments, a thermal interface material may be applied to and/or used along with a board level shield disclosed herein. Example thermal interface materials include thermal gap fillers, thermal phase change materials, thermally-conductive EMI absorbers or hybrid thermal/EMI absorbers, thermal greases, thermal pastes, thermal putties, dispensable thermal interface materials, thermal pads, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A shielding assembly comprising a frame and a cover releasably attachable to, detachable from, and reattachable to the frame, wherein the frame comprises:
   one or more sidewalls;
   an eave extending inwardly along a bottom portion of the one or more sidewalls; and
   one or more solderable tabs that extend inwardly along the eave, the one or more solderable tabs configured to be alienable with and solderable to one or more corresponding electrically-conductive portions along a substrate; and
   wherein:
      the cover includes one or more sidewalls positionable along inner surfaces of the corresponding one or more sidewalls of the frame; and
      attachment of the cover to the frame is within a footprint or outer perimeter defined by the one or more sidewalls of the frame.

2. The shielding assembly of claim 1, wherein the one or more solderable tabs comprise a plurality of solderable tabs spaced apart from each other along an inner perimeter defined by the eave.

3. The shielding assembly of claim 2, wherein:
   the plurality of solderable tabs and the eave cooperatively define a bottommost portion of the frame; and/or
   the plurality of solderable tabs are substantially coplanar with the eave.

4. The shielding assembly of claim 3, wherein the plurality of solderable tabs are alignable with and solderable to solder ball pads along a printed circuit board (PCB).

5. The shielding assembly of claim 4, wherein the plurality of solderable tabs are configured for aligning with solder ball pads according to a preexisting PCB layout that includes or defines an arrangement or array of the solder ball pads along the PCB, whereby the frame is usable with a PCB having the preexisting PCB layout without requiring any changes to the preexisting PCB layout.

6. The shielding assembly of claim 3, wherein the one or more sidewalls of the frame define an open top of the frame without an inwardly extending eave along the open top of the frame.

7. The shielding assembly of claim 1, wherein:
   the one or more solderable tabs and the eave cooperatively define a bottommost portion of the frame; and/or
   the one or more solderable tabs are substantially coplanar with the eave.

8. The shielding assembly of claim 1, wherein the one or more sidewalls of the frame define an open top of the frame without an inwardly extending eave along the open top of the frame.

9. A device comprising the shielding assembly of claim 1 and a printed circuit board (PCB) including a plurality of solder ball pads along the PCB, wherein the one or more solderable tabs of the frame comprise a plurality of solderable tabs that are spaced apart from each other along an inner perimeter defined by the eave and that are soldered to the corresponding solder ball pads along the PCB.

10. A board level shield comprising:
   one or more sidewalls;
   an eave extending inwardly along a bottom portion of the one or more sidewalls;
   one or more solderable tabs that extend inwardly along the eave, the one or more solderable tabs configured to be alignable with and solderable to one or more corresponding electrically-conductive portions along a substrate; and
   a cover releasably attachable to, detachable from, and reattachable to the one or more sidewalls;
   wherein the cover includes one or more sidewalls positionable along inner surfaces of the corresponding one or more sidewalls of the board level shield, and attachment of the cover to the one or more sidewalls of the board level shield is within a footprint or outer perimeter defined by the one or more sidewalls of the board level shield.

11. The board level shield of claim 10, wherein the one or more solderable tabs comprise a plurality of solderable tabs spaced apart from each other along an inner perimeter defined by the eave, and wherein:
   the plurality of solderable tabs and the eave cooperatively define a bottommost portion of the frame; and/or
   the plurality of solderable tabs are substantially coplanar with the eave.

12. The board level shield of claim 11, wherein the board level shield comprises:
   a frame that includes the one or more sidewalls of the board level shield, the eave, and the plurality of solderable tabs; and
   the cover is releasably attachable to, detachable from, and reattachable to the frame, the one or more sidewalls of the cover are positionable along inner surfaces of the corresponding one or more sidewalls of the frame, and attachment of the cover to the frame is within a footprint or outer perimeter defined by the one or more sidewalls of the frame.

13. The board level shield of claim 11, wherein the plurality of solderable tabs are configured for aligning with solder ball pads according to a preexisting PCB layout that includes or defines an arrangement or array of the solder ball pads along the PCB, whereby the board level shield is usable with a PCB having the preexisting PCB layout without requiring any changes to the preexisting PCB layout.

14. A device comprising the board level shield of claim 10 and a printed circuit board (PCB) including a plurality of solder ball pads along the PCB, wherein the one or more solderable tabs of the board level shield comprise a plurality of solderable tabs that are spaced apart from each other along an inner perimeter defined by the eave and that are soldered to the corresponding solder ball pads along the PCB.

15. A board level shield comprising:
   a frame that includes one or more sidewalls, an eave extending inwardly along a bottom portion of the one or more sidewalls, and one or more solderable tabs that extend inwardly along the eave, the one or more solderable tabs configured to be alienable with and solderable to one or more corresponding electrically-conductive portions along a substrate; and
   a cover releasably attachable to, detachable from, and reattachable to the frame;
   wherein the one or more solderable tabs comprise a plurality of solderable tabs spaced apart from each other along an inner perimeter defined by the eave;
   wherein the plurality of solderable tabs and the eave cooperatively define a bottommost portion of the frame; and/or the plurality of solderable tabs are substantially coplanar with the eave; and wherein:
the one or more sidewalls of the frame define an open top of the frame without an inwardly extending eave along the open top of the frame, the cover is configured to cover the open top of the frame when the cover is attached to the frame, and the open top of the frame provides unimpeded access to one or more components through the frame's open top when the cover is not attached to the frame; and/or the cover includes one or more sidewalls positionable along inner surfaces of the corresponding one or more sidewalls of the frame, and attachment of the cover to the frame is within a footprint or outer perimeter defined by the one or more sidewalls of the frame.

\* \* \* \* \*

UNITED STATES PATENT AND TRADEMARK OFFICE
CERTIFICATE OF CORRECTION

PATENT NO. : 10,653,049 B2  
APPLICATION NO. : 16/591029  
DATED : May 12, 2020  
INVENTOR(S) : James D. Pille, Gerald R. English and Timothy M. Wrona Page 1 of 1

It is certified that error appears in the above-identified patent and that said Letters Patent is hereby corrected as shown below:

In the Claims

At Column 13, Line number 17, replace "alienable" with "alignable" in Claim 1.

At Column 14, Line number 58, replace "alienable" with "alignable" in Claim 15.

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*